United States Patent
Han et al.

(10) Patent No.: US 10,359,549 B2
(45) Date of Patent: *Jul. 23, 2019

(54) IMAGE SENSOR INCLUDING NANOSTRUCTURE COLOR FILTER

(71) Applicants: SAMSUNG ELECTRONICS CO., LTD., Suwon-si (KR); CALIFORNIA INSTITUTE OF TECHNOLOGY, Pasadena, CA (US)

(72) Inventors: Seunghoon Han, Suwon-si (KR); Yu Horie, Pasadena, CA (US); Andrei Faraon, Pasadena, CA (US); Sungwoo Hwang, Suwon-si (KR)

(73) Assignees: SAMSUNG ELECTRONICS CO., LTD., Suwon-si (KR); CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/941,799

(22) Filed: Mar. 30, 2018

(65) Prior Publication Data

US 2018/0224587 A1 Aug. 9, 2018

Related U.S. Application Data

(63) Continuation of application No. 14/953,569, filed on Nov. 30, 2015, now Pat. No. 9,958,582.

(30) Foreign Application Priority Data

Jan. 9, 2015 (KR) .................... 10-2015-0003478

(51) Int. Cl.
H04N 3/14 (2006.01)
H04N 5/335 (2011.01)
(Continued)

(52) U.S. Cl.
CPC ........ *G02B 5/201* (2013.01); *H01L 27/14621* (2013.01); *H01L 27/14625* (2013.01); *H01L 27/14685* (2013.01); *G03B 33/16* (2013.01)

(58) Field of Classification Search
CPC .............. H04N 9/045; H04N 2209/046; H01L 27/14621; H01L 27/14627; G06T 3/4015; G02B 5/201
See application file for complete search history.

(56) References Cited

U.S. PATENT DOCUMENTS

2009/0250594 A1 10/2009 Tanaka et al.
2010/0328587 A1* 12/2010 Yamada ............... G02B 5/1809
349/106

(Continued)

FOREIGN PATENT DOCUMENTS

JP          4741015 B2    8/2011
KR   1020120029324 A    3/2012
KR   1020140029933 A    3/2014

*Primary Examiner* — Sinh Tran
*Assistant Examiner* — Selam T Gebriel
(74) *Attorney, Agent, or Firm* — Sughrue Mion, PLLC

(57) ABSTRACT

An image sensor includes an optical sensor layer including a plurality of light-sensitive cells configured to sense light to generate electrical signals, and a color filter array layer disposed on the optical sensor layer and including a plurality of color filters respectively facing the plurality of light-sensitive cells. Each of the plurality of color filters includes a nanostructure in which a first material having a first refractive index and a second material having a second refractive index higher than the first refractive index are arranged. The first material and the second material are alternatively positioned at an interval less than a central wavelength of a color of the color filter. Thus, a thin image sensor having good wavelength selectivity and suitable for obtaining high resolution images is provided.

20 Claims, 10 Drawing Sheets

Related U.S. Application Data

(60) Provisional application No. 62/085,380, filed on Nov. 28, 2014.

(51) Int. Cl.
  *G02B 5/20* (2006.01)
  *H01L 27/146* (2006.01)
  *G03B 33/16* (2006.01)

(56) References Cited

U.S. PATENT DOCUMENTS

| | | |
|---|---|---|
| 2011/0074960 A1 | 3/2011 | Nagata |
| 2012/0001285 A1 | 1/2012 | Kokubun et al. |
| 2012/0300038 A1* | 11/2012 | You .................... G02F 1/017 348/47 |
| 2013/0240708 A1 | 9/2013 | Kokubun |
| 2013/0327927 A1 | 12/2013 | Wano et al. |
| 2015/0323385 A1 | 11/2015 | Han et al. |
| 2016/0274282 A1 | 9/2016 | Shen et al. |

* cited by examiner

IMAGE SENSOR INCLUDING NANOSTRUCTURE COLOR FILTER

CROSS-REFERENCE TO RELATED APPLICATIONS

This application is a continuation of U.S. patent application Ser. No. 14/953,569, filed on Nov. 30, 2015 in the U.S. Patent and Trademark Office, which claims priority from U.S. Provisional Patent Application No. 62/085,380, filed on Nov. 28, 2014 in the U.S. Patent and Trademark Office, and Korean Patent Application No. 10-2015-0003478, filed on Jan. 9, 2015 in the Korean Intellectual Property Office, the disclosures of which are incorporated herein in their entirety by reference.

GOVERNMENT LICENSE RIGHTS

This invention was made with government support under Grant No. W911NF-14-1-0345 awarded by the Army Research Office (ARO), U.S. Army Robert Morris Acquisition Center. The government has certain rights in the invention.

BACKGROUND

1. Field

Apparatuses and methods consistent with exemplary embodiments relate to a high-resolution image sensor.

2. Description of the Related Art

As the number of pixels included in an image sensor has been gradually increased, miniaturization of pixels has been requested. In this regard, the amount of light per pixel and removal of noise between pixels are important issues. Recently, a back-illuminated sensor (BIS) operating based on a cell separation method has been developed.

However, like in the case of color filters and microlenses, the structures of optical components that focus color light toward an optical sensor restrict pixel miniaturization. For example, the thicknesses of an absorptive color filter and a microlens disposed on the color filter to guide light toward the color filter restrict pixel miniaturization.

SUMMARY

One or exemplary embodiments provide image sensors that employ a color filter having a structure suitable for pixel miniaturization.

According to an aspect of an exemplary embodiment, there is provided an image sensor including: an optical sensor layer including a plurality of light-sensitive cells configured to sense light to generate electrical signals; and a color filter array layer disposed on the optical sensor layer and comprising a plurality of color filters respectively facing the plurality of light-sensitive cells. Each of the plurality of color filters includes a nanostructure in which a first material having a first refractive index and a second material having a second refractive index higher than the first refractive index are arranged. The first material and the second material are alternatively positioned at an interval less than a central wavelength of a color of the color filter.

At least two of the plurality of color filters may have nanostructures having different intervals.

A thickness of the nanostructure may be less than the central wavelength of the color of the color filter.

At least two of the plurality of color filters may have nanostructures having different thicknesses.

The plurality of color filters may include a plurality of first color filters configured to transmit light of a first color and reflect and/or absorb light of colors other than the first color; a plurality of second color filters configured to transmit light of a second color and reflect and/or absorb light of colors other than the second color; and a plurality of third color filters configured to transmit light of a third color and reflect and/or absorb light of colors other than the third color, wherein at least two of the plurality of first color filters have nanostructures having different intervals, at least two of the plurality of second color filters have nanostructures having different intervals, and at least two of the plurality of third color filters have nanostructures having different intervals.

The color filter array layer may further include a first layer including a material having a refractive index less than the second refractive index, and the nanostructure may be formed on the first layer.

The refractive index of the first layer may be equal to the first refractive index.

The color filter array layer may further include a second layer including a material having a refractive index less than the second refractive index, and the nanostructure may be formed between the first layer and the second layer.

The refractive indices of the first layer and the second layer may be equal to the first refractive index.

The first material may be polymer, $SiO_2$, or air, and the second material may be Si, $Si_3N_4$, GaP, $TiO_2$, AlSb, AlAs, AlGaAs, AlGaInP, BP, $ZnGeP_2$, or $TiO_2$.

The first material and the second material may be alternately arranged to form a two-dimensional structure.

Two directions of the two-dimensional structure may be different in at least two of the plurality of color filters.

A direction of the two-dimensional structure may be a circumferential direction of a circle on a light-receiving surface which is defined by the plurality of light-sensitive cells, wherein a center of the circle coincides with a center of the light-receiving surface.

A plurality of through holes may be formed in the first material having the first refractive index and may be filled with the second material having the second refractive index.

A plurality of through holes may be formed in the second material having the second refractive index and may be filled with the first material having the first refractive index.

The second material having the second refractive index may form a structure having a strip shape, and the structure having the strip shape may repeat one-dimensionally.

A lengthwise direction of the structure having a stripe shape may differ in at least two of the plurality of color filters.

The lengthwise direction of the structure having a strip shape may be a circumferential direction of a circle on a light-receiving surface which is defined by the plurality of light-sensitive cells, wherein a center of the circle coincides with a center of the light-receiving surface.

The lengthwise direction of the structure having a strip shape may be a radial direction of a circle on a light-receiving surface which is defined by the plurality of light-sensitive cells, wherein a center of the circle coincides with a center of the light-receiving surface.

A fill factor representing a ratio of an area of the second material having the second refractive index to a cross-sectional area of one of the plurality of color filters may differ in at least two of the plurality of color filters.

The fill factor may increase in a direction from a central portion of a light-receiving surface which is defined by the plurality of light-sensitive cells to a peripheral portion of the light-receiving surface.

The fill factor may decrease in a direction from the central portion of a light-receiving surface which is defined by the plurality of light-sensitive cells to the peripheral portion of the light-receiving surface.

Shapes and arrangements of the first material having the first refractive index and the second material having the second refractive index may be determined so that the nanostructure are configured to focus incident light thereon.

According to another aspect of an exemplary embodiment, there is provided an imaging apparatus including: a photographing lens unit configured to focus light reflected from an object and form an optical image; and an image sensor which is configured to convert the optical image formed by the photographing lens unit into an electrical signal and includes an optical sensor layer comprising a plurality of light-sensitive cells configured to sense light to generate electrical signals and a color filter array layer disposed on the optical sensor layer and comprising a plurality of color filters respectively facing the plurality of light-sensitive cells. Each of the plurality of color filters includes a nanostructure in which a first material having a first refractive index and a second material having a second refractive index higher than the first refractive index are arranged. The first material and the second material are alternatively positioned at an interval less than a central wavelength of a color of the color filter.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
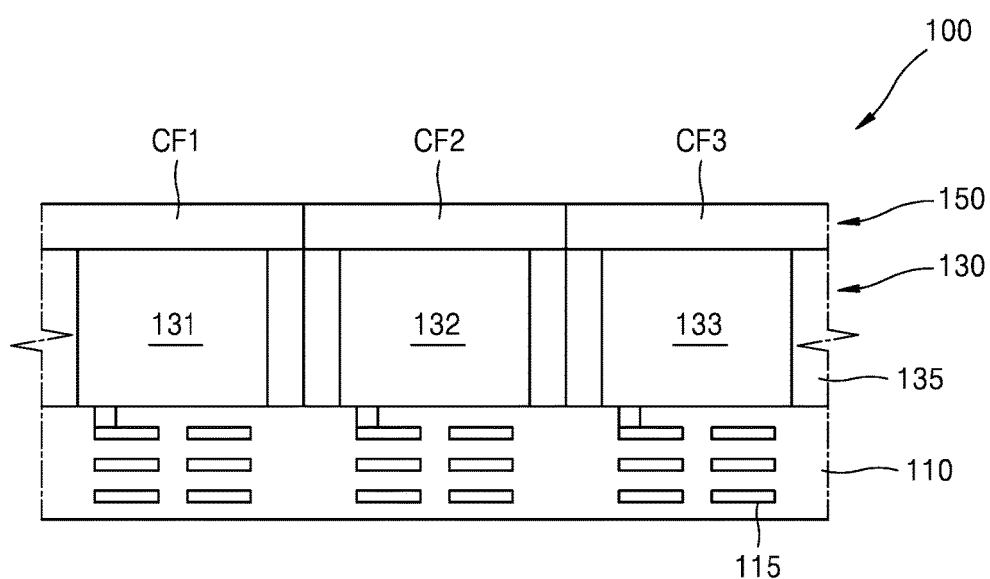
FIG. 1 is a schematic cross-sectional view of an image sensor according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

The sizes of elements may be exaggerated for clarity and for convenience of explanation. In this regard, the present exemplary embodiments may have different forms and should not be construed as being limited to the descriptions set forth herein. It will be understood that when a layer is referred to as being "on" another layer or substrate, it can be directly on the other layer or substrate, or intervening layers may also be present.

FIG. 1 is a schematic cross-sectional view of a structure of an image sensor 100 according to an exemplary embodiment.

The image sensor 100 includes an optical sensor layer 130 including a plurality of light-sensitive cells 131, 132, and 133, which sense light and convert the sensed light into electrical signals, and a color filter array layer 150 disposed on the optical sensor layer 130 and including a plurality of color filters CF1, CF2, and CF3 disposed to face the light-sensitive cells 131, 132, and 133, respectively.

The color filters CF1, CF2, and CF3 may be configured to transmit only light of a first color, light of a second color, and light of a third color, respectively. For example, the first color, the second color, and the third color may be red, green, and blue, respectively. Although only three color filters CF1, CF2, and CF3 are illustrated in FIG. 1, this is only an example and the number of repeatedly arranged color filters CF1, CF2, and CF3 may equal to the number of necessary pixels. In this case, two green color filters, one blue color filter, and one red color filter may be arranged to constitute four pixels, and this arrangement may be repeated. Alternatively, cyan, yellow, green, and magenta color filters may be arranged, and this arrangement may be repeated.

The color filters CF1, CF2, and CF3 and the light-sensitive cells 131, 132, and 133 are arranged to face each other, respectively. This arrangement is repeated such that the numbers of the color filters CF1, CF2, and CF3 and the light-sensitive cells 131, 132, and 133 are each equal to the number of necessary pixels.

The light-sensitive cells 131, 132, and 133 included in the optical sensor layer 130 are independently driven and generate electrical signals having magnitudes that are proportional to the intensities of light beams respectively incident upon the light-sensitive cells 131, 132, and 133. The light-sensitive cells 131, 132, and 133 may include, for example, charge-coupled device (CCD) sensors or complementary metal-oxide semiconductor (CMOS) sensors. Barrier walls 135 may be further included in the image sensor 100 to partition the light-sensitive cells 131, 132, and 133. The barrier walls 135 may prevent light beams obliquely transmitted by the color filters CF1, CF2, and CF3 and obliquely incident upon the light-sensitive cells 131, 132, and 133 from traveling toward light-sensitive cells adjacent to the light-sensitive cells 131, 132, and 133. To achieve this, the barrier walls 135 may be formed of a material that absorbs or reflects light. A material having a lower refractive index than the material of the light-sensitive cells 131, 132, and 133 may be used as the material of the barrier walls 135.

The image sensor 100 may further include a signal wiring layer 110 for reading electric charges accumulated in the optical sensor layer 130. The signal wiring layer 110 includes a plurality of metal wirings 115. The signal wiring layer 110 is disposed below the optical sensor layer 130, and thus light passes through the color filter array layer 150 and is then directly incident on the optical sensor layer 130. This arrangement may provide a higher light efficiency than a structure in which the signal wiring layer 110 is disposed over the optical sensor layer 130, namely, between the color filter array layer 150 and the optical sensor layer 130. When the signal wiring layer 110 is disposed between the optical sensor layer 130 and the color filter array layer 150, light incident on the signal wiring layer 110 may be diffused and reflected by metal wiring, and thus the efficiency with which light reaches the optical sensor layer 130 may be reduced. However, the exemplary embodiments are not required to overcome the disadvantages described above.

An arrangement of the signal wiring layer 110 as illustrated in FIG. 1 is referred to as Back Side Illumination (BSI), and an arrangement of the signal wiring layer 110 between the color filter array layer 150 and the optical sensor layer 130 is referred to as Front Side Illumination (FSI). The image sensor 100 is illustrated as having a BSI structure in FIG. 1, but the present exemplary embodiments are not limited thereto.

In the image sensor 100 according to the present exemplary embodiment, the color filter array layer 150 introduces a nanostructure into the color filters CF1, CF2, and CF3 so that a thickness of the color filter array layer 150 may be reduced as much as possible. In other words, each of the color filters CF1, CF2, and CF3 includes a nanostructure in which two materials having different refractive indices are alternatively arranged at regular intervals. This will now be described later in detail with reference to FIG. 2.

Figure 2:
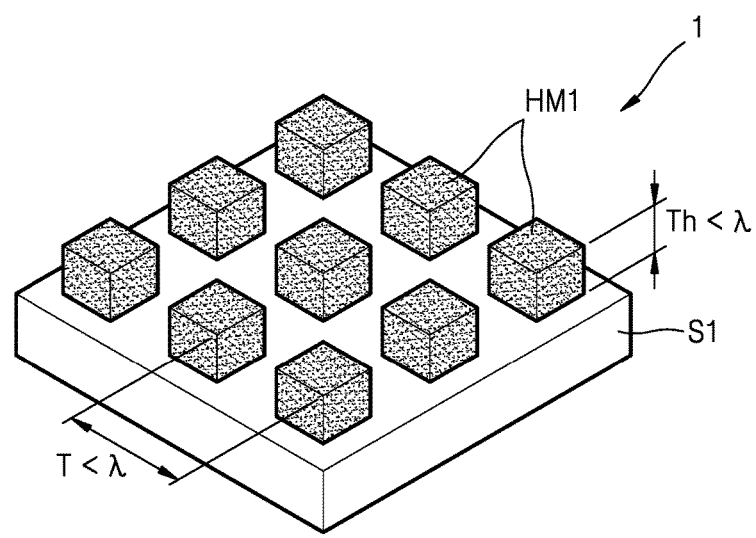
FIG. 2 is a schematic perspective view of a structure of a color filter that is used in an image sensor, according to an exemplary embodiment.

FIG. 2 is a schematic perspective view of a structure of a color filter 1 that may be used as each of the color filters CF1, CF2, and CF3 of the image sensor 100.

The color filter 1 includes high refractive index materials HM1 arranged at an interval T, on a first layer S1. Each of the high refractive index materials HM1 is illustrated as having a hexahedral block shape in FIG. 2, but the present exemplary embodiments are not limited thereto. Each of the high refractive index materials HM1 may have various shapes such as a polyhedral column and a cylinder. Although the high refractive index materials HM1 are two-dimensionally arranged in columns and rows in FIG. 2, the high refractive index materials HM1 in each column or row may be misaligned with each other.

An area between the high refractive index materials HM1 is an empty space, for example, an area where air exists. In other words, a structure in which the high refractive index material HM1 and a low refractive index material, namely, air, are arranged alternately with each other is obtained. This structure transmits light having a predetermined wavelength that is determined according to a difference between refractive indices of each high refractive index material HM1 and the low refractive index material, the interval T, the shape of the high refractive index material HM1, a thickness Th thereof, and the like, and reflects light beams having the other wavelengths.

Each of the color filters CF1, CF2, and CF3 of the image sensor 100 of FIG. 1 may have the structure of the color filter 1 illustrated in FIG. 2. At least one of details such as an interval, a material, a shape, and a thickness may be determined differently among the color filters CF1, CF2, and CF3 so that each of the color filters CF1, CF2, and CF3 may transmit light having a desired wavelength and reflect light beams having the other wavelengths. For example, the material and shape of the high refractive index material HM1 may be the same among the color filters CF1, CF2, and CF3, and the interval or thickness thereof may be determined differently among the color filters CF1, CF2, and CF3 and thus a selection wavelength band may be controlled.

The interval T is less than a wavelength $\lambda$, and may be, for example, ¾ of or less than the wavelength $\lambda$ or half of or less than the wavelength $\lambda$. The thickness Th of each high refractive index material HM1 is less than the wavelength $\lambda$, and may be, for example, half of or less than the wavelength $\lambda$. The wavelength $\lambda$ denotes a central wavelength in a selection wavelength band that is desired to be transmitted or reflected.

In exemplary embodiments below, a structure in which a high refractive index material and a low refractive index material each having a thickness that is less than the wavelength are arranged at an interval that is less than the wavelength is referred to as a nanostructure.

The high refractive index materials HM1 may be single crystal silicon (Si), polycrystal Si, amorphous Si, $Si_3N_4$, GaP, $TiO_2$, AlSb, AlAs, AlGaAs, AlGaInP, BP, or $ZnGeP_2$.

The first layer S1 may be a support for forming a nanostructure. The first layer S1 may be formed of a material having a lower refractive index than the high refractive index materials HM1. A thickness of the first layer S1 may be half of or less than the wavelength $\lambda$. For example, either polymer, such as polydimethylsiloxane (PDMS), or polymethyl methacrylate (PMMA), or $SiO_2$, may be used.

Figure 3:
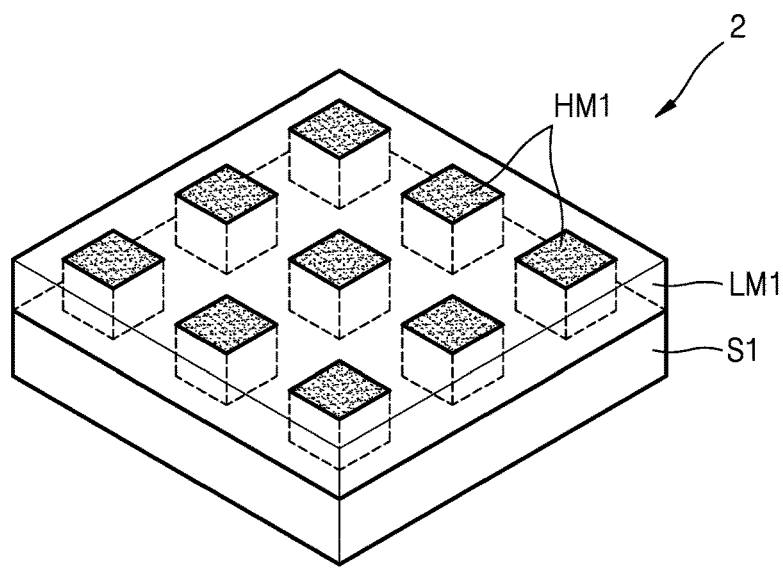
FIG. 3 is a schematic perspective view of a structure of a color filter that is used in an image sensor, according to another exemplary embodiment.

FIG. 3 is a schematic perspective view of a structure of a color filter 2 that is used in an image sensor, according to another exemplary embodiment.

The color filter 2 includes a first layer S1, high refractive index materials HM1 disposed on the first layer S1 at a regular interval, and a low refractive index material LM1 that fills areas between the high refractive index materials HM1. In this structure, a plurality of through holes may be formed in the low refractive index material LM1, and may be filled with the high refractive index materials HM1.

Alternatively, each of the high refractive index materials HM1 may be formed in a pillar shape, and the low refractive index material LM1 may fill the areas between the pillar-shaped high refractive index materials HM1.

The low refractive index material LM1 may have a lower refractive index than the high refractive index materials HM1. For example, either polymer, such as PDMS, or PMMA, or $SiO_2$, may be used.

The first layer S1 may be formed of a material having a refractive index that is lower than the refractive index of each of the high refractive index materials HM1. For example, either polymer, such as PDMS, or PMMA, or $SiO_2$, may be used. The first layer S1 and the low refractive index material LM1 may be formed of the same material or different materials.

Figure 4:
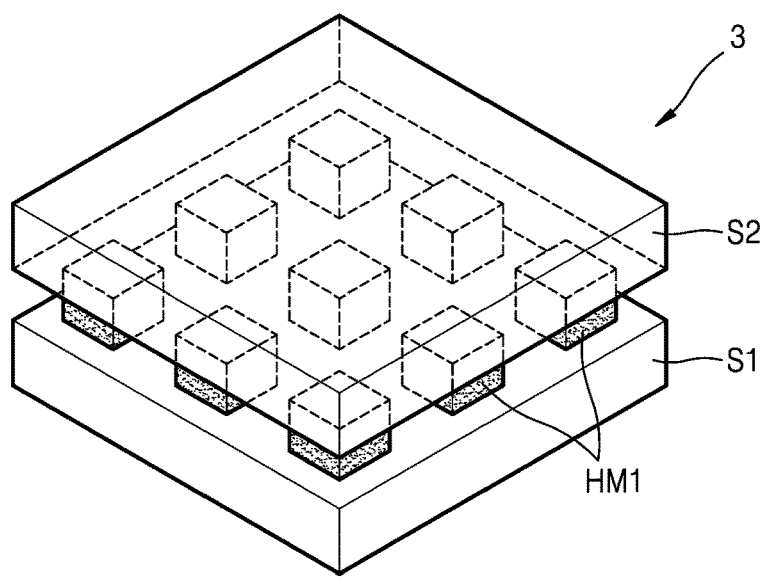
FIG. 4 is a schematic perspective view of a structure of a color filter that is used in an image sensor, according to another exemplary embodiment.

FIG. 4 is a schematic perspective view of a structure of a color filter 3 that is used in an image sensor, according to another exemplary embodiment.

The color filter 3 according to the present exemplary embodiment is different from the color filter 1 of FIG. 2 in that a second layer S2 is further formed on the high refractive index materials HM1. The second layer S2 may be formed of a material having a refractive index that is lower than the refractive index of each of the high refractive index materials HM1, for example, of either polymer, such as PDMS, or PMMA, or $SiO_2$.

Figure 5:
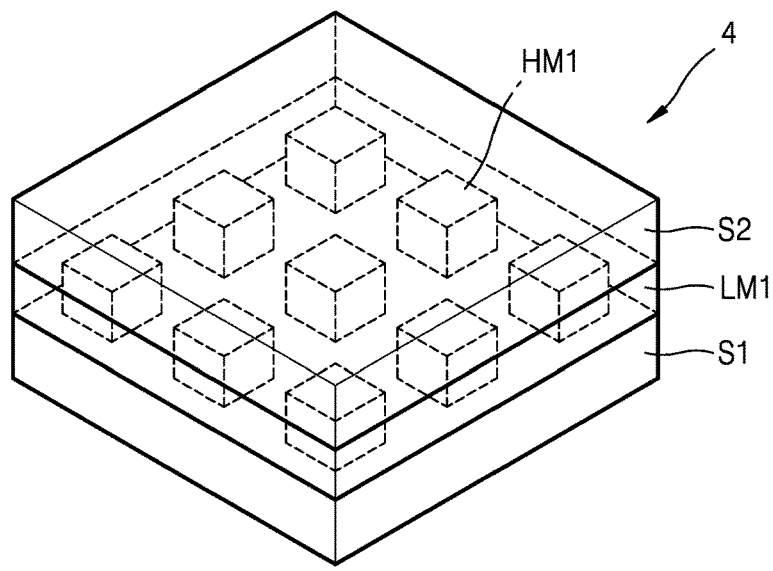
FIG. 5 is a schematic perspective view of a structure of a color filter that is used in an image sensor, according to another exemplary embodiment.

FIG. 5 is a schematic perspective view of a structure of a color filter 4 that is used in an image sensor, according to another exemplary embodiment.

The color filter 4 according to the present exemplary embodiment is different from the color filter 2 of FIG. 3 in that a second layer S2 is further formed on the high refractive index materials HM1. The second layer S2 may be formed of a material having a refractive index that is lower than the refractive index of each of the high refractive index materials HM1, for example, of either polymer, such as PDMS, or PMMA, or $SiO_2$. The second layer S2 and the low refractive index material LM1 may be formed of the same material or different materials.

Figure 6:
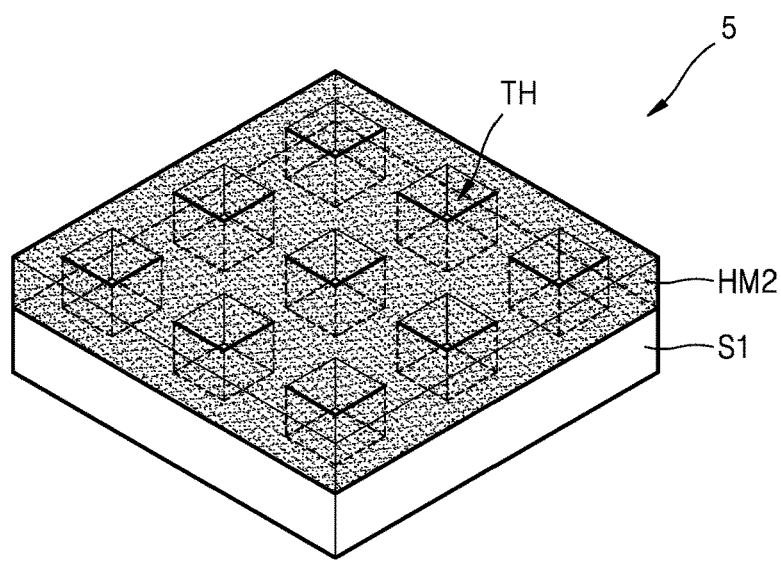
FIG. 6 is a schematic perspective view of a structure of a color filter that is used in an image sensor, according to another exemplary embodiment.

FIG. 6 is a schematic perspective view of a structure of a color filter 5 that is used in an image sensor, according to another exemplary embodiment.

The color filter 5 includes a first layer S1 and a high refractive index material HM2 having a plurality of through holes TH formed therein. The through holes TH may be empty spaces, for example, air spaces, and the high refractive index material HM2 may be single crystal Si, polycrystal Si, amorphous Si, $Si_3N_4$, GaP, $TiO_2$, AlSb, AlAs, AlGaAs, AlGaInP, BP, or $ZnGeP_2$. Air and the high refractive index material HM2 form a nanostructure in which a low refractive index material and a high refractive index material are arranged at a regular interval.

Figure 7:
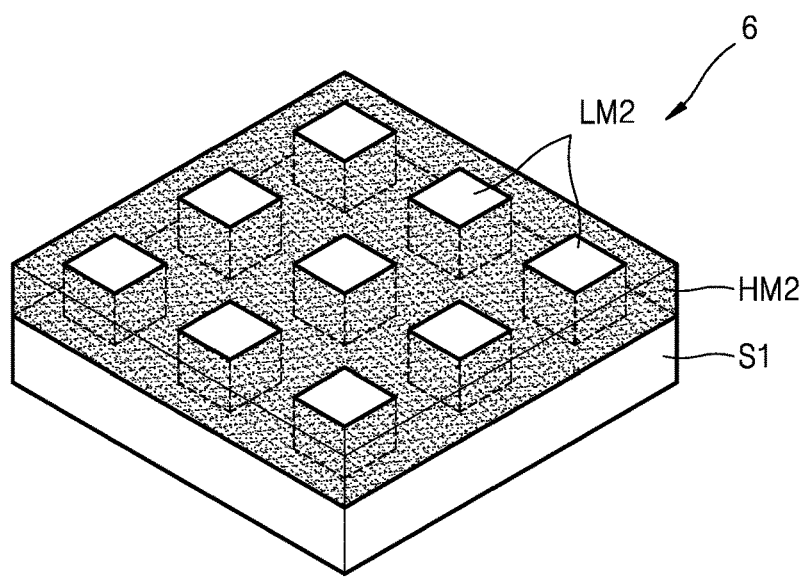
FIG. 7 is a schematic perspective view of a structure of a color filter that is used in an image sensor, according to another exemplary embodiment.

FIG. 7 is a schematic perspective view of a structure of a color filter 6 that is used in an image sensor, according to another exemplary embodiment.

The color filter 6 is different from the color filter 5 of FIG. 6 in that through holes TH of the color filter 6 are filled with a low refractive index material LM2. The low refractive index material LM2 may be a material having a refractive index that is lower than the refractive index of the high refractive index material HM2, for example, may be either polymer, such as PDMS, or PMMA, or $SiO_2$.

Figure 8:
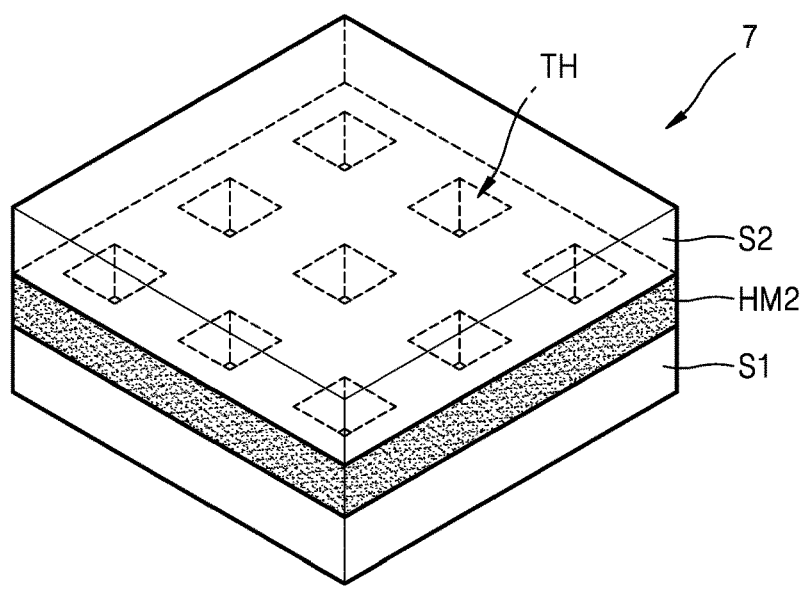
FIG. 8 is a schematic perspective view of a structure of a color filter that is used in an image sensor, according to another exemplary embodiment.

FIG. 8 is a schematic perspective view of a structure of a color filter 7 that is used in an image sensor, according to another exemplary embodiment.

The color filter 7 according to the present exemplary embodiment is different from the color filter 5 of FIG. 6 in that a second layer S2 is further formed on the high refractive index material HM2.

Figure 9:
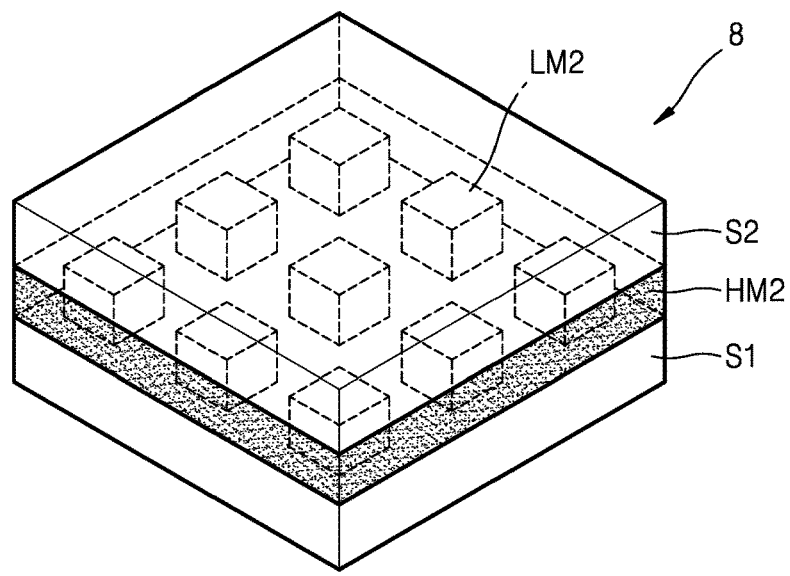
FIG. 9 is a schematic perspective view of a structure of a color filter that is used in an image sensor, according to another exemplary embodiment.

FIG. 9 is a schematic perspective view of a structure of a color filter 8 that is used in an image sensor, according to another exemplary embodiment.

The color filter 8 according to the present exemplary embodiment is different from the color filter 6 of FIG. 7 in that a second layer S2 is further formed on the high refractive index material HM2.

Figure 10:
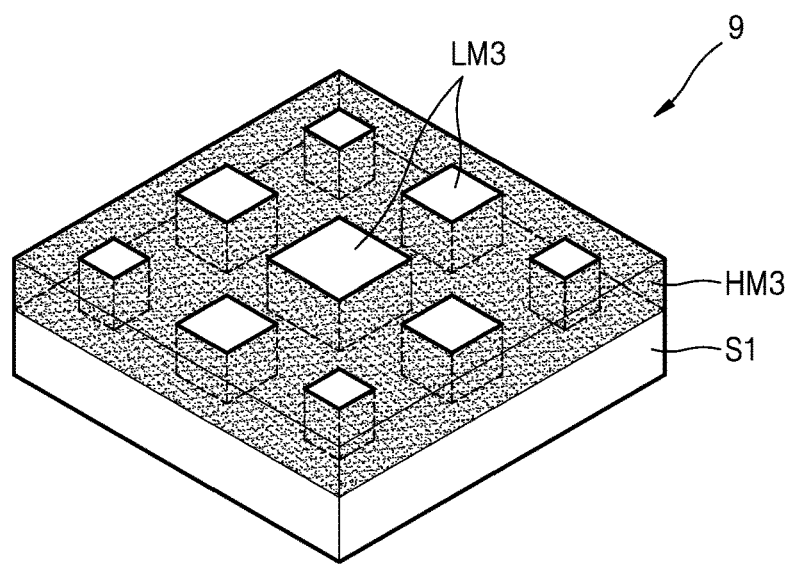
FIG. 10 is a schematic perspective view of a structure of a color filter that is used in an image sensor, according to another exemplary embodiment.

FIG. 10 is a schematic perspective view of a structure of a color filter 9 that is used in an image sensor, according to another exemplary embodiment.

The color filter 9 according to the present exemplary embodiment is different from the above-described exemplary embodiments in that a fill factor is not constant. The fill factor is the ratio of an area of a high refractive index material HM3 to the total area of a light-receiving surface of the color filter 9, namely, a cross-sectional surface parallel to the first layer S1, in a nanostructure.

The high refractive index material HM3 may be single crystal Si, polycrystal Si, amorphous Si, $Si_3N_4$, GaP, $TiO_2$, AlSb, AlAs, AlGaAs, AlGaInP, BP, or $ZnGeP_2$. Low refractive index materials LM3 may be a material having a refractive index that is lower than the refractive index of the high refractive index material HM3, for example, may be either polymer, such as PDMS, or PMMA, or $SiO_2$.

By controlling the fill factor, the directivity in which the color filter 9 transmits light having a specific wavelength from among incident light may be controlled. For example, when light penetrates through the color filter 9 and is then incident on the optical sensor layer 130 of FIG. 1, the light may be effectively focused on a light-sensitive cell corresponding to the color filter 9. In FIG. 10, the fill factor is lowered by increasing the area of a low refractive index material LM3 in a central portion of the color filter 9 and is increased in order to decrease the area of a low refractive index material LM3 in a peripheral portion thereof. However, FIG. 10 illustrates that the directivity of transmitted light may be controlled by controlling the fill factor, and exemplary embodiments are not limited thereto. A change in the fill factor may be controlled differently according to a location on which the color filter 9 is arranged relative to the other color filters within the image sensor. This will be described later with reference to FIG. 15.

The fill factor may not be constant, and the interval of the nanostructure may be maintained constant. Alternatively, as long as wavelength selectivity for a corresponding color is maintained, the interval of the nanostructure may be slightly changed along columns or rows or according to distances from the center of the image sensor.

The color filter 9 of FIG. 10 is a result of changing a fill factor of the color filter 6 of FIG. 7, but this is only an example. The change in the fill factor may be equally applied to the color filters of FIGS. 2-9.

Figure 11:
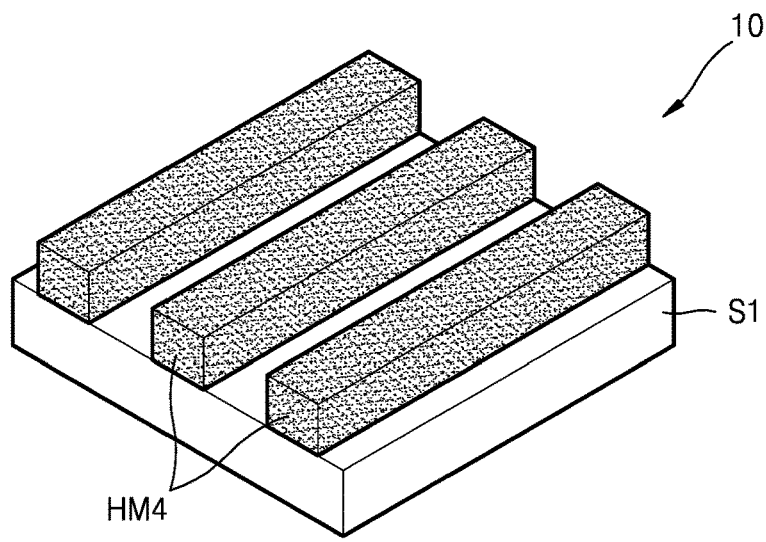
FIG. 11 is a schematic perspective view of a structure of a color filter that is used in an image sensor, according to another exemplary embodiment.

FIG. 11 is a schematic perspective view of a structure of a color filter 10 that is used in an image sensor, according to another exemplary embodiment.

The color filter 10 is different from the above-described exemplary embodiments in that high refractive index materials HM4 are repeated one-dimensionally. Each of the high refractive index materials HM4 protrudes in a strip shape, and the high refractive index materials HM4 are repeatedly arranged in a different direction from the lengthwise direction of the strip. For example, the strips may be repeatedly arranged in a direction perpendicular to the lengthwise direction of the strip, but the present exemplary embodiments are not limited thereto. Areas between the high refractive index materials HM4 are empty spaces, namely, air spaces. The high refractive index materials HM4 may be single crystal Si, polycrystal Si, amorphous Si, $Si_3N_4$, GaP, $TiO_2$, AlSb, AlAs, AlGaAs, AlGaInP, BP, or $ZnGeP_2$.

Figure 12:
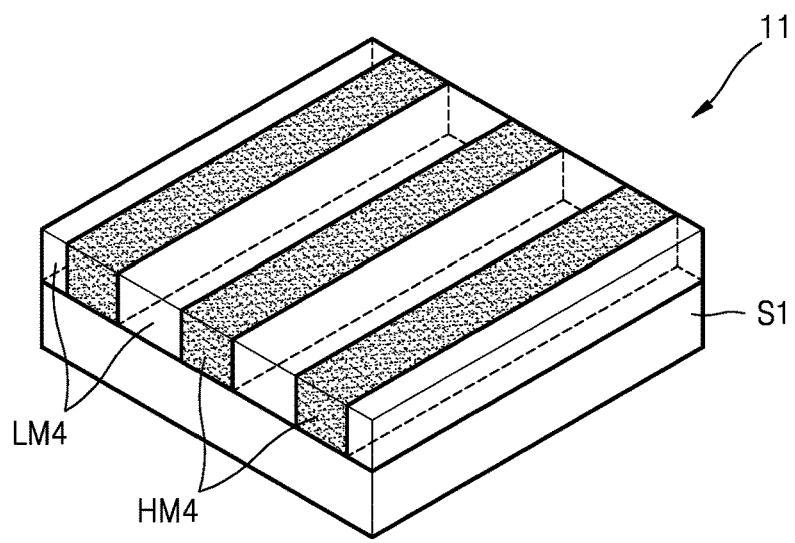
FIG. 12 is a schematic perspective view of a structure of a color filter that is used in an image sensor, according to another exemplary embodiment.

FIG. 12 is a schematic perspective view of a structure of a color filter 11 that is used in an image sensor, according to another exemplary embodiment.

The color filter 11 according to the present exemplary embodiment is different from the color filter 10 of FIG. 11 in that the areas between the high refractive index materials HM4 are filled with low refractive index materials LM4. The low refractive index materials LM4 may be a material having a refractive index that is lower than the refractive index of each of the high refractive index materials HM4, for example, may be either polymer, such as PDMS, or PMMA, or $SiO_2$.

Figure 13:
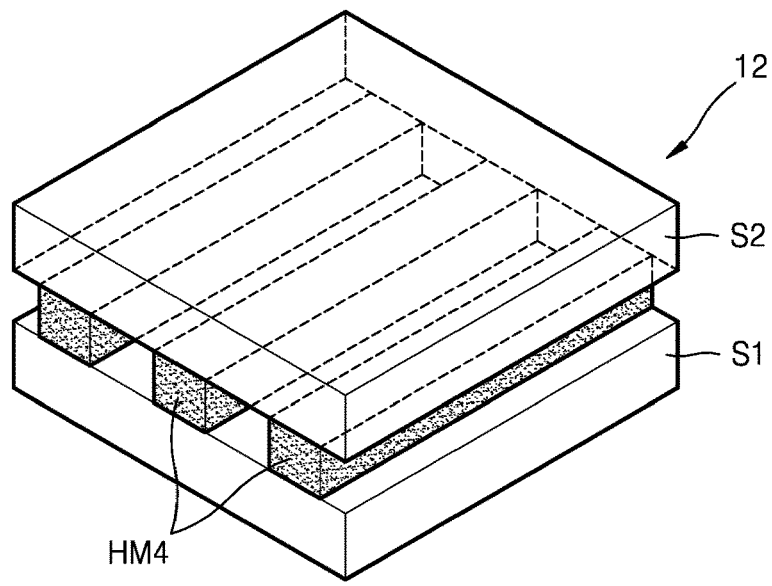
FIG. 13 is a schematic perspective view of a structure of a color filter that is used in an image sensor, according to another exemplary embodiment.

FIG. 13 is a schematic perspective view of a structure of a color filter 12 that is used in an image sensor, according to another exemplary embodiment.

The color filter 12 according to the present exemplary embodiment is different from the color filter 10 of FIG. 11 in that a second layer S2 is further formed on the high refractive index materials HM4.

Figure 14:
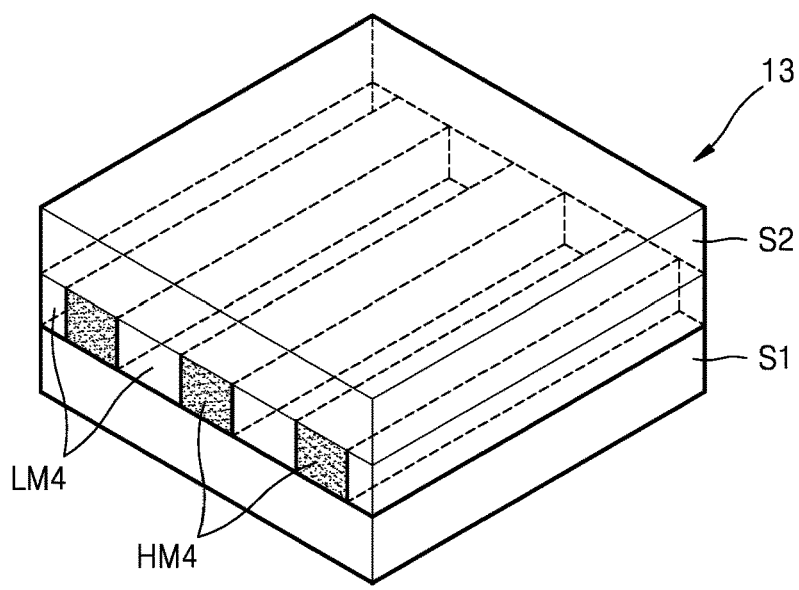
FIG. 14 is a schematic perspective view of a structure of a color filter that is used in an image sensor, according to another exemplary embodiment.

FIG. 14 is a schematic perspective view of a structure of a color filter 13 that is used in an image sensor, according to another exemplary embodiment.

The color filter 13 according to the present exemplary embodiment is different from the color filter 11 of FIG. 12 in that a second layer S2 is further formed on the high refractive index materials HM4.

Figure 15:
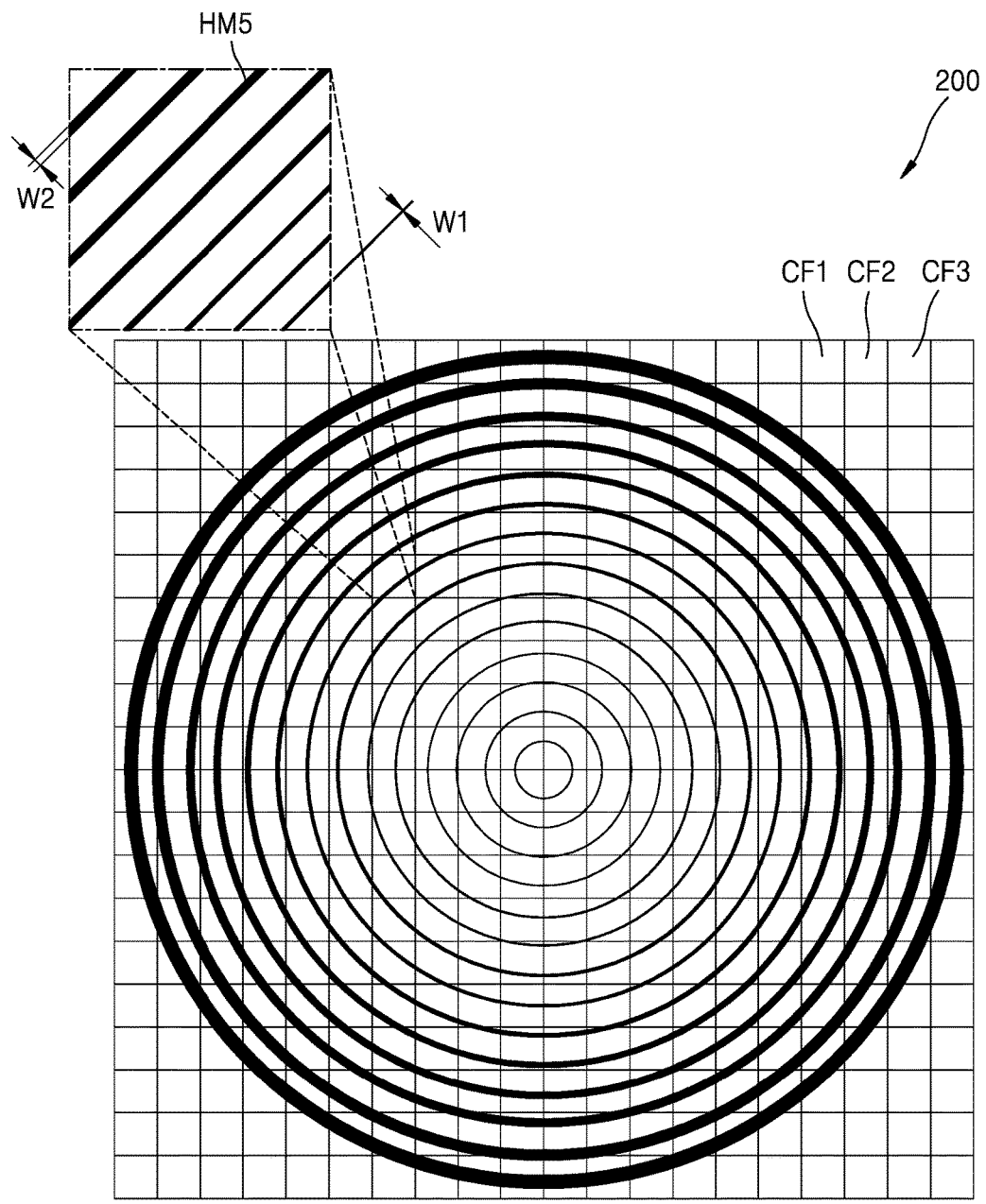
FIG. 15 is a plan view conceptually illustrating a variation in details of a nanostructure according to relative positions of a plurality of color filters arranged in an image sensor according to an exemplary embodiment.

FIG. 15 is a plan view conceptually illustrating a variation in details of a nanostructure according to relative positions of the color filters CF1, CF2, and CF3 arranged in an image sensor 200 according to an exemplary embodiment.

Concentric circles illustrated in FIG. 15 conceptually represent a lengthwise direction and a fill factor of a high refractive index material HM5 in a nanostructure included in each of the color filters CF1, CF2, and CF3.

In FIG. 15, changes in a lengthwise direction of a nanostructure form a circle. However, FIG. 15 is a schematic diagram for convenience of explanation. FIG. 15 illustrates nanostructures of color filters for the same color. In other words, FIG. 15 may be a plan view conceptually illustrating nanostructures included in the color filters CF1 for first color light, a plan view conceptually illustrating nanostructures included in the color filters CF2 for second color light, or a plan view conceptually illustrating nanostructures included in the color filters CF3 for third color light.

Each nanostructure has a one-dimensional arrangement of the high refractive index materials HM5 having strip shapes. The lengthwise direction of the nanostructure varies according to a relative position of a color filter corresponding to the nanostructure within the image sensor 200. The lengthwise direction may be a circumferential direction of a circle on a light-receiving surface, wherein a center of the circle coincides with a center of the light-receiving surface. The light-receiving surface may be defined as a surface formed by light incidence surfaces of light-sensitive cells that face the color filters CF1, CF2, and CF3. The lengthwise directions of the nanostructures of the color filters CF1, CF2, and CF3 may be determined to be the circumferential directions at locations of the color filters CF1, CF2, and CF3.

The fill factor of the high refractive index materials HM5 may increase from a central portion of the image sensor 200 to a peripheral portion thereof. When an arbitrary color filter is magnified as illustrated in FIG. 15, a width W1 of a high refractive index material HM5 positioned near the central portion of the image sensor 200 is less than a width W2 of a high refractive index material HM5 positioned near the peripheral portion thereof. The fill factor of the high refractive index materials HM5 varies with locations within the image sensor 200 since an angle at which light is incident on the image sensor 200 may vary with locations on the image sensor 200. In other words, details of the change in the fill factor may be determined in consideration of the angle at which light is incident on the image sensor 200. For example, when the image sensor 200 is used in an imaging apparatus, an angle at which light is incident on the central portion of the image sensor 200 is different from an angle at which light is incident on the peripheral portion of the image sensor 200. The angle at which light is incident on the central portion of the image sensor 200 is close to 0°, that is, a vertical incidence angle, whereas an incidence angle of light increases in a direction toward the peripheral portion of the image sensor 200 and thus light is obliquely incident on the peripheral portion thereof.

When wavelength selectivity is designed with a nanostructure, an optimal design value of the wavelength selectivity is closely related with the incidence angle of light. Thus, a dispersion map graph representing reflectivity a wave vector component, and a wavelength may be predicted according to details (material, interval, thickness, shape, and the like) of the nanostructure, and nanostructures that are used in color filters arranged in the image sensor 200 may be designed differently according to relative positions of the color filters by referring to the dispersion map graph.

Although the fill factor of the high refractive index materials HM5 within a color filter increases in a direction from the central portion of the image sensor 200 to the peripheral portion thereof in FIG. 15, this is only an example. The fill factor of the high refractive index materials HM5 may be constant within a single color filter and may vary only between color filters having different relative positions. This fill factor variation does not mean that all of color filters of the same kind that are arranged at different locations within the image sensor 200 have different fill factors, but may mean that at least two color filters of the same kind may have different fill factors.

Similarly, nanostructure length directions of all of color filters of the same kind included in the image sensor 200 are not different according to relative locations within the image sensor 200, and at least two color filters may have different nanostructure length directions.

According to a modified exemplary embodiment, in contrast with the exemplary embodiment of FIG. 15, the fill factor of the high refractive index materials HM5 may decrease from the central portion of the image sensor 200 to the peripheral portion thereof.

Figure 16:
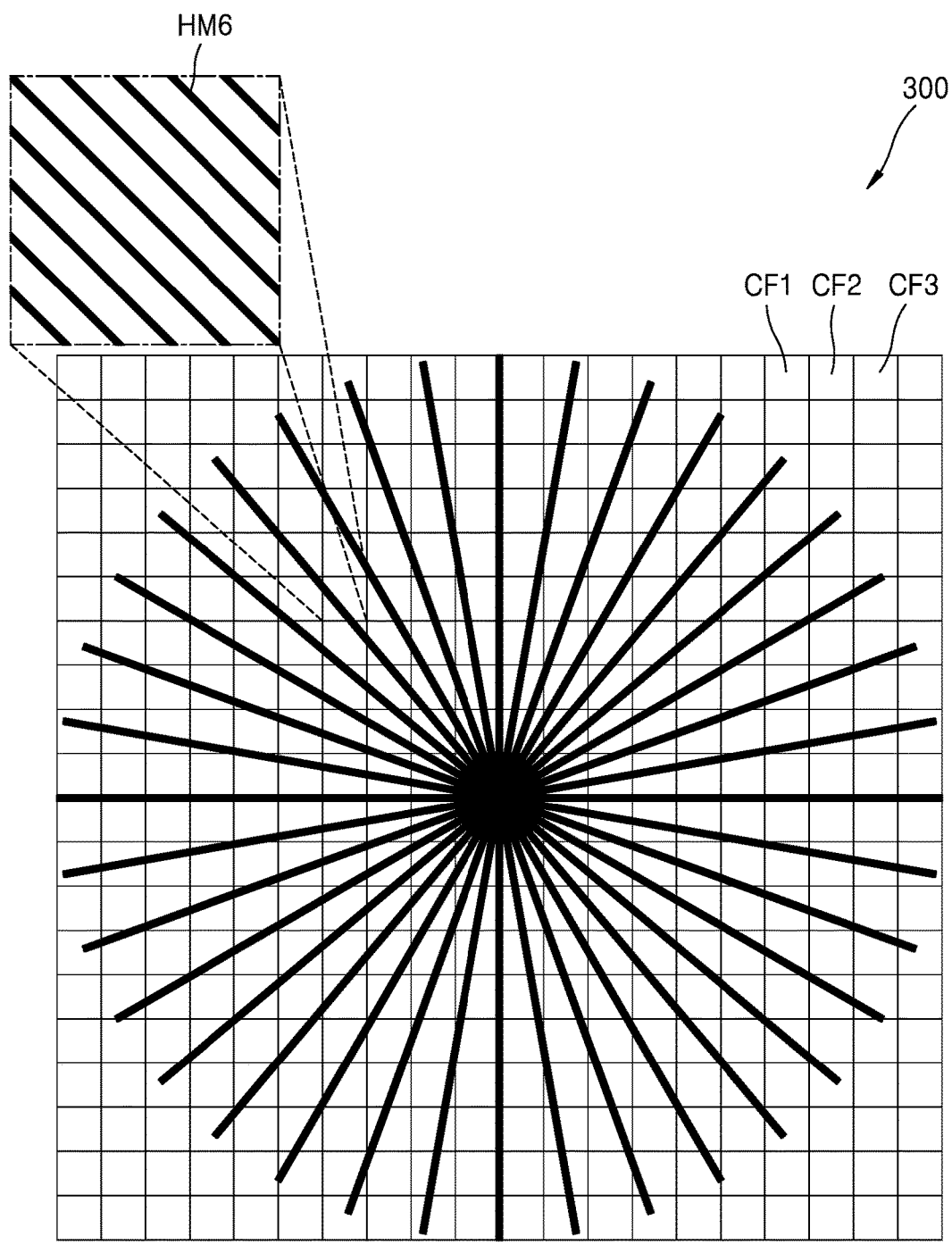
FIG. 16 is a plan view conceptually illustrating a variation in details of a nanostructure according to relative positions of a plurality of color filters arranged in an image sensor according to another exemplary embodiment.

FIG. 16 is a plan view conceptually illustrating a variation in details of a nanostructure according to relative positions of the color filters CF1, CF2, and CF3 arranged in an image sensor 300 according to another exemplary embodiment.

Figure 17:
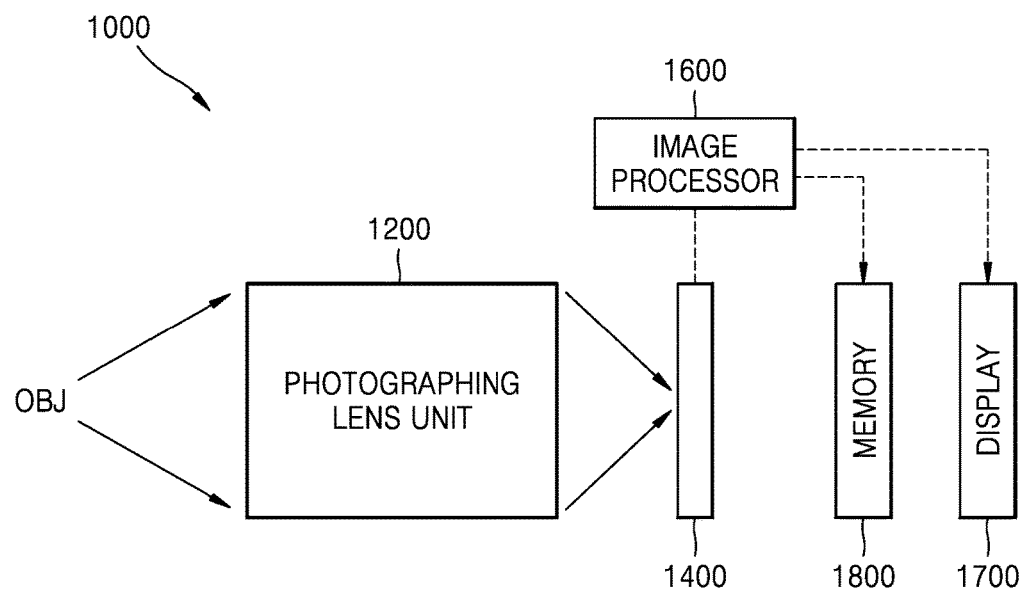
FIG. 17 is a schematic diagram of a structure of an imaging apparatus according to an exemplary embodiment.

FIG. 17 conceptually illustrates a lengthwise direction of a high refractive index material HM6 that is used in a nanostructure included in each of the color filters CF1, CF2, and CF3. In FIG. 16, changes in the lengthwise directions of nanostructures form lines. However, FIG. 16 is a schematic diagram for convenience of explanation. FIG. 16 illustrates nanostructures of color filters for the same color. In other words, FIG. 16 may be a plan view conceptually illustrating nanostructures included in the color filters CF1 for first color light, a plan view conceptually illustrating nanostructures included in the color filters CF2 for second color light, or a plan view conceptually illustrating nanostructures included in the color filters CF3 for third color light.

Each nanostructure is a one-dimensional arrangement of the high refractive index materials HM6 having strip shapes, and a lengthwise direction of the nanostructure varies according to relative positions of color filters within the image sensor 300. The lengthwise direction may be a radial direction of a circle on a light-receiving surface that has a center that coincides with a center of the light-receiving surface. The light-receiving surface may be defined as a surface formed by light incidence surfaces of light-sensitive cells that face the color filters CF1, CF2, and CF3. The lengthwise directions of the nanostructures of the color filters CF1, CF2, and CF3 may be determined to be the radial directions at locations of the color filters CF1, CF2, and CF3.

Similar to FIG. 15, in FIG. 16, nanostructure length directions of all of color filters of the same kind arranged at different relative locations within the image sensor 200 are not different, and at least two color filters of the same kind may have different nanostructure length directions.

FIGS. 15 and 16 illustrate an example in which details of a color filter may vary according to different locations within an image sensor. The details of a color filter may be variously modified according to the features of various optical apparatuses employing image sensors (for example, according to incidence angles).

FIGS. 15 and 16 illustrate that a nanostructure is a one-dimensional arrangement of strips, but a combination of the nanostructures of FIGS. 15 and 16 may be applied as a two-dimensionally arranged nanostructure to an image sensor according to another exemplary embodiment. In other words, two directions forming two dimensions may vary according to respective relative positions of color filters within an image sensor. One of the two directions may be a circumferential direction as in FIG. 15, and the other may be a radial direction as in FIG. 16.

Since optical characteristics of a color filter used in the above-described image sensor are determined according to an interval, a shape, an arrangement, and the like of a nanostructure, a structure that is suitable for a specific wavelength or incidence angle may be obtained. Thus, wavelength selectivity is excellent, and it is easy to control a color bandwidth.

The thickness of the color filter is less than a wavelength, namely, is thin, and a microlens may be omitted by designing a nanostructure that performs a function of the microlens. Thus, a thin image sensor may be obtained.

FIG. 17 is a schematic diagram of a structure of an imaging apparatus 1000 according to an exemplary embodiment.

The imaging apparatus 1000 includes a photographing lens unit 1200, which focuses light reflected or emitted from an object OBJ to form an optical image, and an image sensor 1400, which converts the optical image formed by the photographing lens unit 1200 into an electrical signal. An infrared block filter may be further disposed between the image sensor 1400 and the photographing lens unit 1200.

The image sensor 1400 may be one of the image sensors 100, 200, and 300 according to the above-described exemplary embodiments, or a combination thereof, and each of the color filters CF1, CF2, and CF3 that are used in the image sensor 1400 may be one of the color filters 1-13 according to the above-described exemplary embodiments.

The imaging apparatus 1000 further includes an image processor 1600 which processes the electrical signal formed by the image sensor 1400 to form an image signal. The image processor 1600 forms an image by performing noise removal, color interpolation, and the like with respect to a color signal sensed by the image sensor 1400. The imaging apparatus 1000 may further include a display 1700, which displays an image formed by the image processor 1600, and a memory 1800, which store image data formed by the image processor 1600.

The image sensor 1400 may be formed to be thin, by employing a color filter having a nanostructure as described above, and thus may have a structure that is suitable for high resolution. Since the image sensor 1400 may include a color filter that is designed in consideration of an angle at which light is incident on each location within the image sensor 1400, the imaging apparatus 1000 may have high color reproducibility.

The above-described image sensor structure may be applied to the fields in which many pieces of pixel information are required as pixels are miniaturized and high-resolution image sensors are demanded, for example, in the fields of color image sensor pixel arrays for light field 3D cameras and sensor arrays for hyperspectral imaging.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An image sensor comprising:
an optical sensor layer comprising a plurality of light-sensitive cells configured to sense light to generate electrical signals; and
a color filter array layer disposed on the optical sensor layer and comprising a plurality of color filters respectively facing the plurality of light-sensitive cells in a vertical direction of the image sensor, the plurality of color filters including a plurality of first color filters, a plurality of second color filters, and a plurality of third color filters, which filter different color, wherein
at least one of the plurality of color filters comprises a plurality of nanostructures formed of a first material having a first refractive index, and a second material adjacent to the plurality of nanostructures and has a second refractive index less than the first refractive index,
the plurality of nanostructures are disposed on the optical sensor layer at a first pitch in a horizontal direction of the image sensor, and
the first pitch is less than a central wavelength of a filtering color of the at least one of the plurality of color filters, and
shapes and an arrangement of the plurality of nanostructures are configured so that at least two of the plurality of first color filters, two of the plurality of second color filters, or two of the plurality of third color filters have different shape and arrangement from each other.

2. The image sensor of claim 1, wherein another one of the plurality of color filters comprises a plurality of nanostructures disposed apart from each other at a second pitch.

3. The image sensor of claim 1, wherein a thickness of the plurality of nanostructures is less than the central wavelength.

4. The image sensor of claim 1, wherein the plurality of nanostructures of the at least one of the plurality of color filters has a first thickness, and a plurality of nanostructures of another one of the plurality of color filters has a second thickness.

5. The image sensor of claim 1, wherein the plurality of nanostructures are shaped and arranged such that a plurality of strip structures repeats one-dimensionally.

6. The image sensor of claim 1, wherein
the color filter array layer further comprises a first layer having a refractive index less than the first refractive index, and
the plurality of nanostructures is formed on the first layer.

7. The image sensor of claim 6, wherein the refractive index of the first layer is equal to the second refractive index.

8. The image sensor of claim 1, wherein
the color filter array layer further comprises a first layer having a refractive index less than the first refractive index, and a second layer having a refractive index less than the first refractive index, and
the plurality of nanostructures is formed between the first layer and the second layer.

9. The image sensor of claim 8, wherein the refractive indices of the first layer and the second layer are equal to the second refractive index.

10. The image sensor of claim 1, wherein
the first material is Si, $Si_3N_4$, GaP, $TiO_2$, AlSb, AlAs, AlGaAs, AlGaInP, BP, $ZnGeP_2$, or $TiO_2$ and
the second material is polymer, $SiO_2$, or air.

11. The image sensor of claim 1, wherein the first material and the second material are alternately arranged to form a two-dimensional structure.

12. The image sensor of claim 11, wherein two directions of the two-dimensional structure are different in at least two of the plurality of color filters.

13. The image sensor of claim 11, wherein a direction of the two-dimensional structure is a circumferential direction of a circle on a light-receiving surface which is defined by the plurality of light-sensitive cells, wherein a center of the circle coincides with a center of the light-receiving surface.

14. The image sensor of claim 1, wherein the color filter array layer comprises a plurality of through holes in which the first material is filled.

15. The image sensor of claim 14, wherein the plurality of through holes is surrounded by the second material.

16. An image sensor comprising:
an optical sensor layer comprising a plurality of light-sensitive cells configured to sense light to generate electrical signals; and
a color filter array layer disposed on the optical sensor layer and comprising a plurality of color filters respectively facing the plurality of light-sensitive cells in a vertical direction of the image sensor, wherein
at least one of the plurality of color filters comprises a plurality of nanostructures formed of a first material having a first refractive index, and a second material adjacent to the plurality of nanostructures and has a second refractive index less than the first refractive index,
the plurality of nanostructures are disposed on the optical sensor layer at a first pitch in a horizontal direction of the image sensor, and
the first pitch is less than a central wavelength of a filtering color of the at least one of the plurality of color filters, and
the plurality of nanostructures are shaped and arranged such that a plurality of strip structures repeats one-dimensionally.

17. The image sensor of claim 16, wherein a lengthwise direction of the strip structure differs in at least two of the plurality of color filters.

18. The image sensor of claim 16, wherein the plurality of color filters includes a plurality of first color filters, a plurality of second color filters, and a plurality of third color filters, which filter different color, and
a lengthwise direction of the strip structure differs in at least two of the plurality of first color filters, two of the plurality of second color filter, or two of the plurality of third color filter.

19. An imaging apparatus comprising:
a photographing lens unit configured to focus light reflected from an object and form an optical image; and
an image sensor of claim 1 which is configured to convert the optical image formed by the photographing lens unit into an electrical signal.

20. An imaging apparatus comprising:
a photographing lens unit configured to focus light reflected from an object and form an optical image; and
an image sensor of claim 16 which is configured to convert the optical image formed by the photographing lens unit into an electrical signal.

* * * * *